United States Patent
Giebler et al.

(12) 
(10) Patent No.: US 6,583,401 B2
(45) Date of Patent: Jun. 24, 2003

(54) OPTOELECTRONIC COMPONENT WITH A CONDUCTOR STRIP ELEMENT

(75) Inventors: Siegfried Giebler, Wuestenrot (DE); Georg Herok, Neckarsulm (DE)

(73) Assignee: Vishay Semiconductor GmbH, Heilbronn (DE)

( * ) Notice: Subject to any disclaimer, the term of this patent is extended or adjusted under 35 U.S.C. 154(b) by 0 days.

(21) Appl. No.: 10/054,426

(22) Filed: Jan. 18, 2002

(65) Prior Publication Data

US 2002/0092971 A1 Jul. 18, 2002

(30) Foreign Application Priority Data

Jan. 18, 2001 (DE) .......................................... 101 02 119

(51) Int. Cl.⁷ ............................................... H01L 31/00
(52) U.S. Cl. ..................... 250/214.1; 250/239; 257/433
(58) Field of Search ............................. 250/214.1, 239, 250/216; 257/81, 82, 98, 99, 100, 659, 660, 432, 433, 434, 691, 626; 438/64, 65

(56) References Cited

U.S. PATENT DOCUMENTS

| | | | |
|---|---|---|---|
| 4,100,422 A | * | 7/1978 | Thillays ...................... 250/511 |
| 4,446,375 A | * | 5/1984 | Aird ............................ 250/551 |
| 4,967,081 A | * | 10/1990 | Quad et al. ............... 250/338.1 |
| 5,350,943 A | | 9/1994 | Angerstein et al. |
| 5,352,925 A | * | 10/1994 | Sudoh et al. ................ 257/659 |
| 5,432,340 A | | 7/1995 | Shibata |
| 6,111,761 A | * | 8/2000 | Peana et al. ................. 257/659 |
| 6,211,554 B1 | * | 4/2001 | Whitney ....................... 257/659 |
| 6,335,548 B1 | * | 1/2002 | Roberts et al. .............. 250/551 |
| 6,417,946 B1 | * | 7/2002 | Krieger ....................... 257/100 |

FOREIGN PATENT DOCUMENTS

| | | |
|---|---|---|
| DE | 4212948 | 10/1993 |
| EP | 0524406 | 1/1993 |
| EP | 0566921 | 10/1993 |
| JP | 63136838 | 6/1988 |
| JP | 10190275 | 7/1998 |
| JP | 11154758 | 6/1999 |

* cited by examiner

Primary Examiner—Diego Gutierrez
Assistant Examiner—Travis Reis
(74) Attorney, Agent, or Firm—W. F. Fasse; W. G. Fasse

(57) ABSTRACT

A further miniaturization of known optoelectronic components with internal screening is not possible. In addition, inhomogeneities occur in the embedding material. Separate screening plates cause additional costs to arise during component assembly. The task is to design an optoelectronic component with a conductor strip element such that screening can be effected without any additional external screening measures.

Optoelectronic component with a conductor strip element, with electronic and optoelectronic semiconductor components being arranged on a first conductor strip element area connected to ground and encapsulated by a housing made of thermo- or duroplastic synthetic material. A second conductor strip element area protrudes from the housing and is folded around the housing such that it screens the semiconductor components against electromagnetic interference radiation.

The invention is particularly suitable for opto-electronic components such as, for example, photo modules that are to be mounted in top-view position as well as in side-view position and which contain electronic or optoelectronic semiconductor components that need to be protected against electromagnetic interference radiation.

15 Claims, 2 Drawing Sheets

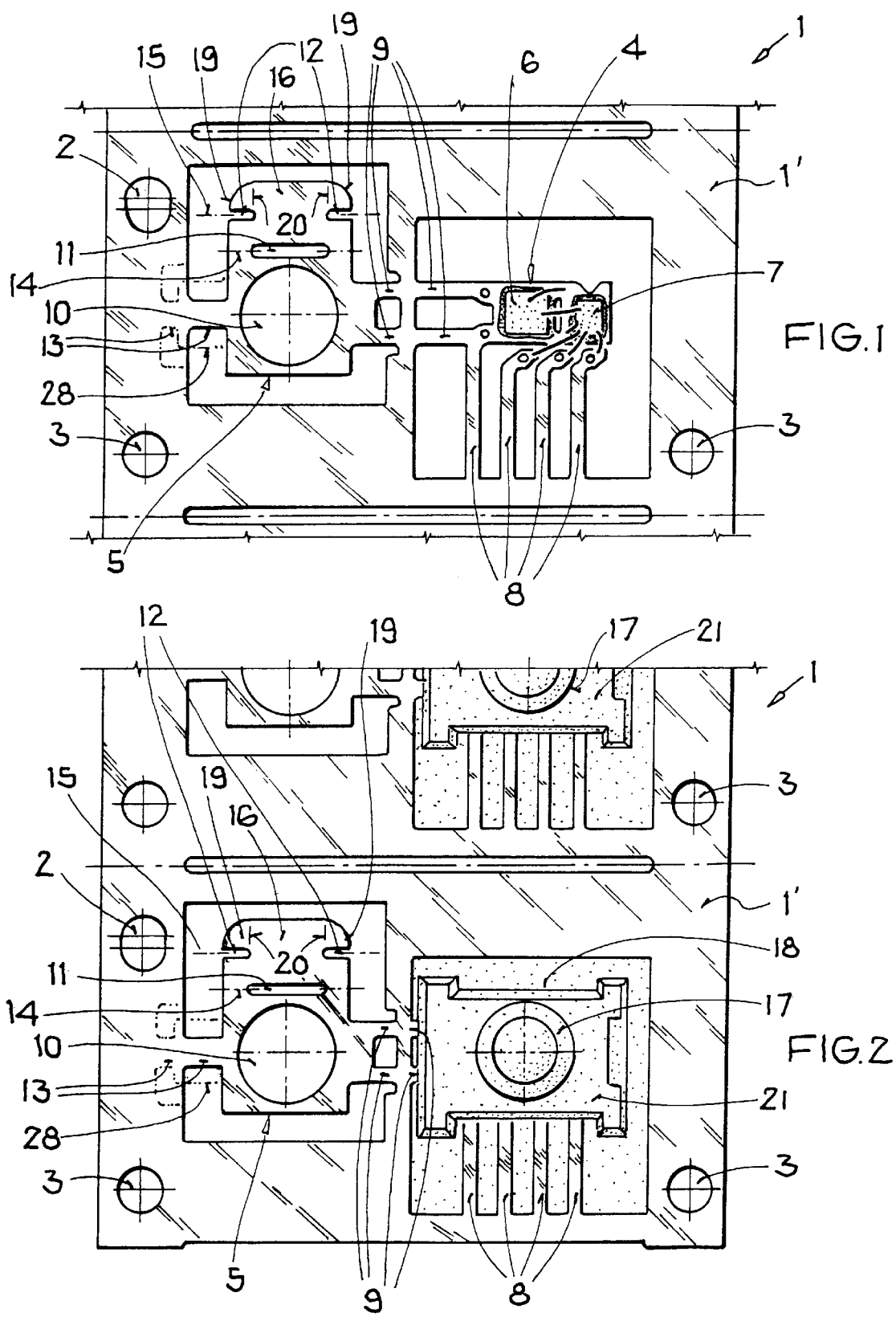

OPTOELECTRONIC COMPONENT WITH A CONDUCTOR STRIP ELEMENT

BACKGROUND OF THE INVENTION

The invention relates to an optoelectronic component with a conductor strip element and a procedure for manufacture.

Such a state of the art optoelectronic component with a conductor strip element is known, for example, from the European patent publication EP 0 566 921 A1. For electromagnetic screening within its housing, this component features a folded-over strip element encapsulated by embedding compound. However, a minimum thickness of the embedding material above the screening is necessary. For this reason and due to the internal arrangement of this component, further miniaturization is not possible. A further disadvantage is that inhomogeneities occur in the embedding material between the semiconductor components and the screening.

From the Patent Abstract of Japan No. 11154758 A, it is known that, for electromagnetic screening, the housing of an optical receiver unit for infrared control signals—consisting of synthetic resin—needs to be coated with nickel. The coating of the synthetic resin housing with a nickel layer represents a very costly and work-intensive process. An additional difficulty is presented by the zone which must not be coated with nickel in order to remain transparent for infrared radiation. Furthermore, it is difficult to connect the nickel layer to ground.

In addition, for electromagnetic screening, separate metal parts are known, e.g. from the documents EP 0 524 406 A1 or U.S. Pat. No. 5,432,340, that are manufactured as separate screening plates or hoods and arranged around the component areas to be protected. The disadvantage of such separate screening plates is that additional costs arise during component assembly.

SUMMARY OF THE INVENTION

The object of the invention is to provide for the design of an optoelectronic component with a conductor strip element such that a screening of its parts to be protected against electromagnetic interference radiation can be effected without any additional external screening measures.

According to the invention there is an optoelectronic component with a conductor strip element, with electronic and optoelectronic semiconductor components being arranged on a first conductor strip element area connected to ground and encapsulated by a housing made of thermoplastic or duroplastic (i.e. thermoset) synthetic material, wherein a second conductor strip element area—also connected to ground—protrudes from the housing and is folded around the housing such that it will screen the semiconductor components against electromagnetic interference radiation and a procedure for the manufacture of an optoelectronic component, with the following process steps:
Provision of a conductor strip element connected to ground, with a first conductor strip element area,
Mounting and contacting electronic and optoelectronic semiconductor components on the first conductor strip element area,
Manufacture of a housing around the first conductor strip element area and the semiconductor components by molding with a thermoplastic or duroplastic material, wherein
a second conductor strip element area is folded around the housing as an electromagnetic screen.

The invention has the advantages that, when compared with the existing components, much more compact housing formats can be implemented, also as top-view-side-view combinations (top-view: optical axis runs vertical to the mounting plane, side-view: optical axis runs in parallel to the mounting plane). Due to the design and construction selected, the galvanic connection of the screening element to ground will remain intact nevertheless.

The invention is particularly suitable for opto-electronic components such as, for example, photo modules that are to be mounted in top-view position as well as in side-view position and which contain electronic or optoelectronic semiconductor components that need to be protected against electromagnetic interference radiation.

BRIEF DESCRIPTION OF THE DRAWINGS

In the following the invention will be explained by means of an embodiment example and the drawing. The figures below show:

FIG. 1: a two-part conductor strip element populated with electronic and optoelectronic semiconductor components, FIG. 2: the conductor strip element from FIG. 1, whose first conductor strip element area with the semiconductor components is encapsulated by embedding material, and FIGS. 3a, b: two perspective views of a ready-mounted optoelectronic component with a bent-over second conductor strip element area for screening.

DESCRIPTION OF THE PREFERRED EMBODIMENTS

Figure 3A:
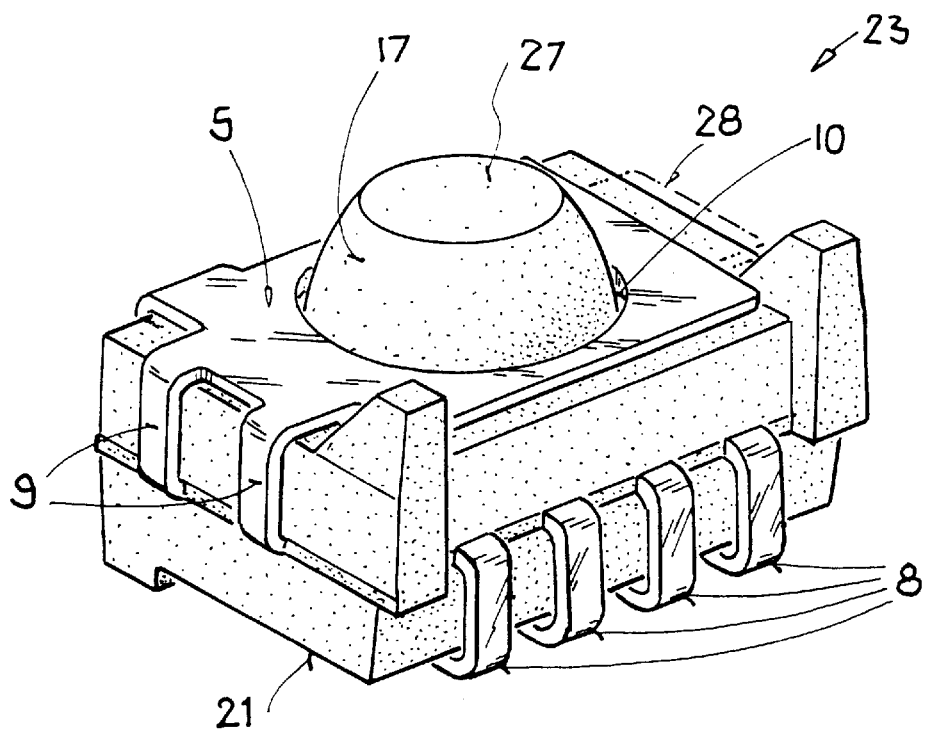

FIG. 1 shows a section from a conductor strip element 1 with a frame 1' with the conductor strip element 1 being manufactured, using the known process, by punching or etching from a thin longitudinal strip of sheet metal, and features longitudinal positioning apertures 2, round transportation apertures 3, and connection pins 8. Furthermore the conductor strip element 1 comprises a first conductor strip element area 4 and a second conductor strip element area 5, with the first conductor strip element area 4 being populated with an optoelectronic semiconductor component 6, for example a receiver for infrared radiation, as well as with an electronic semiconductor component 7, for example, an integrated circuit. The first conductor strip element area 4 can be populated with further optoelectronic and electronic semiconductor components.

The connection pins 8 are later bent-over twice and bent into a specific form and are preliminarily used to connect the first conductor strip element area 4 with the frame 1'. One of the connection pins 8, which is later connected to ground, forms a component part of the conductor strip element 1, so that both conductor strip element areas 4 and 5 are connected to ground. The semiconductor components 6, 7 are contacted with one another, or with the conductor strip element 1 in the known manner.

The second conductor strip element area 5 is connected to the first conductor strip element area 4 by means of one or several lands 9, and features a first aperture 10, a second aperture 11, two notches or cuts 12 and a further land 13 connected to the frame of the conductor strip element 1. Although the land 13 only serves to connect the second conductor strip element area 5 to the frame 1', and is later separated from the conductor strip element area 5, it can also remain connected to the conductor strip element area 5 as a part of the screening (and is then separated from frame 1'). Instead of the two lands 9 for connecting the two conductor strip element areas 4 and 5, it is also possible to use a single wider land 9. Two wings 19 follow the two notches or cuts 12 and, when the conductor strip element 1 is manufactured, are angled off by a small angle along a respective bending line 20 (the purpose of this will be explained below).

The first aperture 10 advantageously features a circular form with a specific diameter and is located approximately at the center of the conductor strip element area 5; the second aperture 11 preferably features a longitudinal form with a longitudinal axis 14. The longitudinal axis 14 also represents a bending line, along which at a later point in time a part section 16 of the second conductor strip element area 5 is bent over at an approximate right angle. The two notches or cuts 12 run along a line 15, which in turn runs in parallel to the bending line or longitudinal axis 14 of aperture 11.

FIG. 2 shows the conductor strip element 1 with the unchanged conductor strip element area 5. In order to produce a housing 21, the first conductor strip element area 4, with the semiconductor components 6, 7 (FIG. 1) mounted on the same, is encapsulated by means of a molding process with a thomorplastic or duroplastic (i.e. thermoset) synthetic material transparent to infrared radiation, e.g. a synthetic resin suitable for injection molding.

A round flattened lens 17 for focusing the infrared radiation is integrated in housing 21. The form and diameter of lens 17 and the form and diameter of aperture 10 in the second conductor strip element area 5 are matched so that lens 17 fits through the aperture 10. Furthermore, housing 21 features a recess 18 which is dimensioned such that the part section 16, which is to be bent over, from the second conductor strip element area 5, fits into this recess 18.

If the land 13, for screening, remains connected to the second conductor strip element area 5, then the housing 21 can advantageously feature a further recess, which is dimensioned such that it can accommodate land 13. The lens 17 is flattened and thus obtains a grip surface 27, to allow the suction needle of an automatic assembly machine to dock onto this grip surface 27.

Figure 3B:
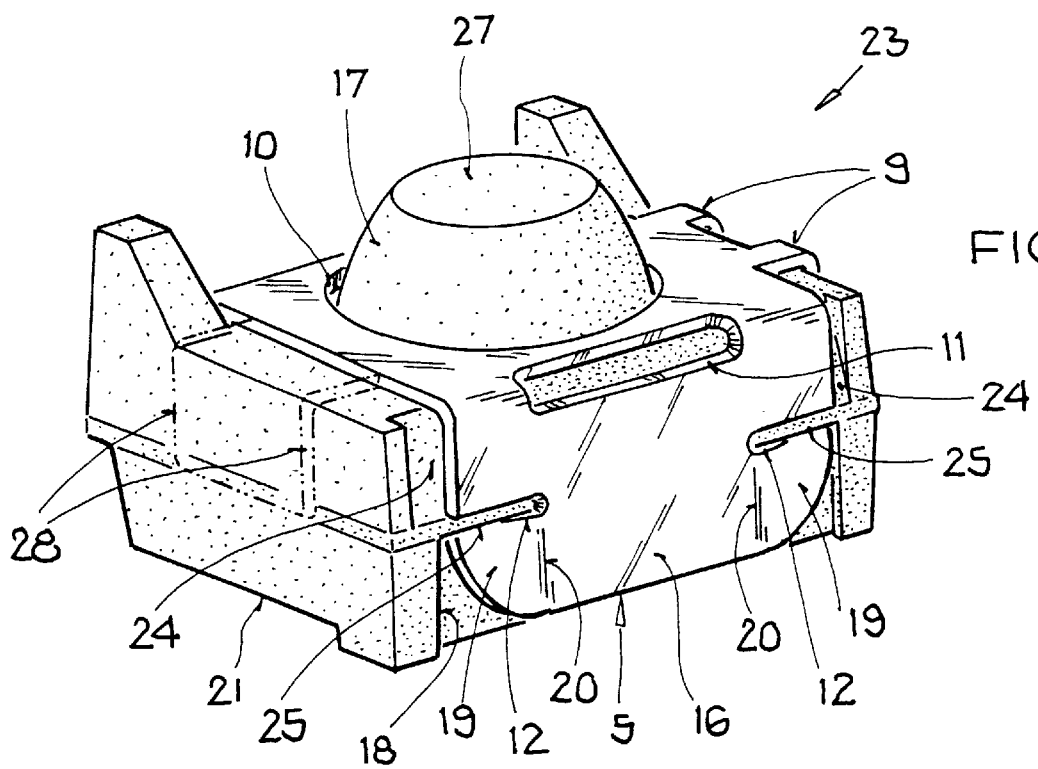

FIGS. 3a and 3b, respectively, show a perspective view of a ready-mounted optoelectronic component 23 which may be, for example, a photo module fitted into audio or video systems which photo module receives by means of infrared radiation the control commands from a remote control unit and passes them on as electrical signals.

The connection pins 8 are bent over twice so that the component 23 can be assembled onto a printed circuit board in top-view position or in side-view position. The lands 9 are also bent over twice, and the second conductor strip element area 5, as a screening against electromagnetic interference radiation, is thus folded over housing 21 such that the lens 17 protrudes through the aperture 10. If the land 13 has not been removed, it can be simply angled off as a side screening shield 28 (drawn in by a dotted line). The side screening shield 28 can also be designed such that it is longer, angled twice and bent around the housing 21 within a possibly existing recess, so that the screening second conductor strip element area 5 does not spring back.

Another possibility to prevent the conductor strip element area 5 from springing back is to provide an incline 24 within the recess 18 in housing 21, which incline ends as a sharp-edged step 25. After the part 16 of the conductor strip element area 5 is bent along line 14 at an approximate right angle, the wings 19, angled around a small angle along the respective bending line 20, will slide along the incline 24 when the second conductor strip element area 5 is folded over; and the wings 19 will engage on step 25; this will hold the entire conductor strip element area 5 in this position, and prevent the same from springing back. This second possibility to prevent the conductor strip element area 5 from springing back can alternatively be also applied to the second screening shield 28 and the possibly existing associated recess in housing 21.

The invention shows a simple way in which electronic or optoelectronic components such as e.g. photo modules can be protected against electromagnetic interference radiation.

What is claimed is:

1. An optoelectronic component (23) comprising:
    a conductor strip element (1) having
    a first conductor strip element area (4), connected to ground, and
    a second conductor strip element area (5), also connected to ground;
    electronic and optoelectronic semiconductor components (6,7) arranged on said first conductor strip element area (4);
    a housing (21) made thermoplastic or thermoset synthetic material and encapsulating said first conductor strip element area (4);
    wherein,
    said second conductor strip element area (5) protrudes from said housing (21) and is folded around said housing (21) such that
    said second conductor strip element area (5) will screen said electronic and optoelectronic semiconductor components (6,7) against electromagnetic interference radiation.

2. Optoelectronic component (23) according to claim 1 wherein the two conductor strip element areas (4,5) are connected to one another by means of one or several lands (9).

3. The optoelectronic component (23) according to claim 2, wherein the second conductor strip element area (5) features a further land (13).

4. The optoelectronic component (23) according to claim 3, wherein the further land (13) is bent around the housing (21) when the second conductor strip element area (5) is folded over.

5. The optoelectronic component (23) according to claim 3, wherein the housing (21) features a recess for further land (13).

6. The optoelectronic component (23) according to claim 1, wherein a lens (17) is integrated into the housing (21).

7. The optoelectronic component (23) according to claim 1, wherein the second conductor strip element area (5) features an aperture (10) according.

8. The optoelectronic component (23) according to claim 7, wherein a lens (17) is integrated into the housing (21), and wherein the form and diameter of the lens (17) and the form and diameter of the aperture (10) are matched.

9. The optoelectronic component (23) according to claim 1, wherein the second conductor strip element area (5) features a part section (16) to be bent over.

10. The optoelectronic component (23) according to claim 9, wherein the part section (16) features two notches or cuts (12).

11. The optoelectronic component (23) according to claim 10, wherein each notch (12) is followed by a wing (19).

12. The optoelectronic component (23) according to claim 11, wherein each wing (19) is angled off by a small angle.

13. The optoelectronic component (23) according to claim 1, wherein the housing (21) features an incline (24) with a final step (25).

14. The optoelectronic component (23) according to claim 12, wherein the housing (21) features an incline (24) with a final step (25), and the angled wings (19) are engaged in the step (25) when the conductor strip element area (5) is folded over.

15. A method of manufacturing an optoelectronic component (23), comprising the steps of provuding a conductor trip element (1) connected to ground, said conductor strip element having a first conductor strip element area (4) and a second conductor strip area (5);

mounting and contacting electronic and optoelectronic semiconductor components (6, 7) on said firs conductor strip element area (4);

forming a thermoplastic or thermoset material molded housing (21) around said first conductor strip element area (4) and electronic and optoelectronic semiconductor components (6, 7) so that said second conductor strip element area (5) protrudes from said housing (21);

and folding said second conductor strip element area around said housing (21) as an electromagnetic screen.

* * * * *